(12) United States Patent
Justesen et al.

(10) Patent No.: US 8,941,968 B2
(45) Date of Patent: Jan. 27, 2015

(54) HEATED ELECTROSTATIC CHUCK INCLUDING MECHANICAL CLAMP CAPABILITY AT HIGH TEMPERATURE

(75) Inventors: Perry J. I. Justesen, Beverly, MA (US); Allan D. Weed, Marblehead, MA (US); William Davis Lee, Newburyport, MA (US); Ashwin M. Purohit, Gloucester, MA (US); Robert D. Rathmell, Murphy, TX (US); Gary M. Cook, Newton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 554 days.

(21) Appl. No.: 13/152,735

(22) Filed: Jun. 3, 2011

(65) Prior Publication Data

US 2011/0299217 A1    Dec. 8, 2011

Related U.S. Application Data

(60) Provisional application No. 61/352,554, filed on Jun. 8, 2010, provisional application No. 61/352,665, filed on Jun. 8, 2010.

(51) Int. Cl.
   *H01L 21/687*    (2006.01)
   *H01L 21/683*    (2006.01)

(52) U.S. Cl.
   CPC ...... *H01L 21/68728* (2013.01); *H01L 21/6831* (2013.01)
   USPC ............................................. 361/234

(58) Field of Classification Search
   CPC .............................................. H01L 21/68771
   USPC ....................................................... 361/234
   See application file for complete search history.

(56) References Cited

U.S. PATENT DOCUMENTS

| | | |
|---|---|---|
| 5,059,770 A | 10/1991 | Mahawili |
| 5,155,652 A | 10/1992 | Logan et al. |
| 5,262,029 A | 11/1993 | Erskine et al. |
| 5,294,778 A | 3/1994 | Carman et al. |

(Continued)

FOREIGN PATENT DOCUMENTS

EP    0847085 A2 *  6/1998

OTHER PUBLICATIONS

Office Action dated Sep. 5, 2013 for U.S. Appl. No. 13/154,836.

(Continued)

*Primary Examiner* — Rexford Barnie
*Assistant Examiner* — Ann Hoang
(74) *Attorney, Agent, or Firm* — Eschweiler & Associates, LLC

(57) ABSTRACT

An electrostatic clamp is provided, having a clamping plate, wherein a clamping surface of the clamping plate is configured to contact the workpiece. A voltage applied to one or more electrodes selectively electrostatically attracts the workpiece to the clamping surface. One or more auxiliary clamping members are further provided wherein the one or more auxiliary clamping members are configured to selectively secure at least a portion of the workpiece to the clamping surface. A temperature monitoring device configured to determine a temperature of the workpiece is provided, and a controller is configured to selectively clamp the workpiece to the clamping surface via a control of the voltage to the one or more electrodes and the one or more auxiliary clamping members, based, at least in part, on the temperature of the workpiece.

24 Claims, 9 Drawing Sheets

(56) References Cited

U.S. PATENT DOCUMENTS

| | | |
|---|---|---|
| 5,350,479 A | 9/1994 | Collins et al. |
| 5,663,865 A | 9/1997 | Kawada et al. |
| 5,793,192 A * | 8/1998 | Kubly et al. ............... 323/312 |
| 5,968,273 A | 10/1999 | Kadomura et al. |
| 6,034,863 A | 3/2000 | Marohl et al. |
| 6,065,499 A | 5/2000 | Pless et al. |
| 6,080,970 A | 6/2000 | Yoshida et al. |
| 6,088,213 A | 7/2000 | Herchen |
| 6,273,484 B1 * | 8/2001 | Peng ............................ 294/86.4 |
| 6,476,399 B1 | 11/2002 | Harrington et al. |
| 6,483,690 B1 * | 11/2002 | Nakajima et al. ............. 361/234 |
| 6,730,175 B2 | 5/2004 | Yudovsky et al. |
| 8,478,116 B2 | 7/2013 | Henry et al. |
| 2002/0014894 A1 | 2/2002 | Yonezawa et al. |
| 2003/0218144 A1 * | 11/2003 | Lin et al. ................ 250/559.29 |
| 2005/0076531 A1 * | 4/2005 | Smith et al. .................... 34/313 |
| 2008/0067436 A1 | 3/2008 | Vanderberg et al. |
| 2008/0144251 A1 | 6/2008 | Tao et al. |
| 2009/0114158 A1 | 5/2009 | Zucker et al. |
| 2009/0273878 A1 | 11/2009 | Lee et al. |
| 2010/0110603 A1 | 5/2010 | LaFontaine et al. |
| 2010/0171044 A1 | 7/2010 | Lee et al. |
| 2011/0260047 A1 | 10/2011 | Lee |
| 2011/0291023 A1 | 12/2011 | Lee et al. |
| 2011/0291030 A1 | 12/2011 | Lee |
| 2011/0292562 A1 | 12/2011 | Lee et al. |
| 2011/0297845 A1 | 12/2011 | Ota et al. |
| 2011/0299218 A1 | 12/2011 | Lee et al. |

OTHER PUBLICATIONS

U.S. Appl. No. 13/154,836, filed Jun. 7, 2011. 22 Pages.
Notice of Allowance Dated Mar. 31, 2014 U.S. Appl. No. 13/154,836.

* cited by examiner

United States Patent US 8,941,968 B2

HEATED ELECTROSTATIC CHUCK INCLUDING MECHANICAL CLAMP CAPABILITY AT HIGH TEMPERATURE

REFERENCE TO RELATED APPLICATION

This application claims priority to and the benefit of U.S. Provisional Application Ser. No. 61/352,554 which was filed Jun. 8, 2010, entitled "HEATED ELECTROSTATIC CHUCK INCLUDING MECHANICAL CLAMP CAPABILITY AT HIGH TEMPERATURE", and U.S. Provisional Application Ser. No. 61/352,665 which was also filed Jun. 8, 2010, entitled "HEATED ANNULUS CHUCK", the entireties of which are hereby incorporated by reference as if fully set forth herein.

FIELD OF THE INVENTION

The present invention relates generally to semiconductor processing equipment, including, but not limited to, ion implantation systems, and more specifically to an electrostatic chuck having a mechanical clamping capability for use in specific ion implantation applications.

BACKGROUND OF THE INVENTION

Electrostatic clamps or chucks (ESCs) are often utilized in the semiconductor manufacturing industry for clamping workpieces or substrates into a fixed position on a support surface during plasma-based or vacuum-based semiconductor processes such as ion implantation, etching, chemical vapor deposition (CVD), etc. Electrostatic clamping capabilities of these ESCs, as well as workpiece temperature control, have proven to be quite valuable in processing semiconductor substrates, workpieces or wafers, such as silicon wafers. A typical ESC, for example, comprises a dielectric layer positioned over a conductive electrode or backing plate, wherein the semiconductor wafer is placed on a surface of the ESC (e.g., the wafer is placed on a surface of the dielectric layer), which operates as a support surface for the wafer as it is being processed. During semiconductor processing (e.g., ion implantation), a clamping voltage is typically applied between the wafer and the electrode, whereby the wafer is clamped against the chuck surface by electrostatic forces.

In some circumstances, it is desirable to perform high temperature processing on a workpiece. Such high temperatures (e.g., approaching 1000 C), however, can adversely affect the electrostatic clamping force exhibited by conventional ESCs.

SUMMARY OF THE INVENTION

The present disclosure addresses a need found by the inventors for an improved electrostatic clamp wherein high temperature processing on a workpiece can be performed, while adequately maintaining a clamping force on the workpiece. The present invention thus overcomes the limitations of the prior art by providing a system, apparatus, and method for clamping workpieces in a semiconductor processing system. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward an apparatus, system, and method for selectively maintaining a position of a workpiece on a support surface. An electrostatic clamp is provided, comprising a clamping plate having a support or clamping surface, wherein the clamping surface is configured to contact the workpiece. One or more electrodes are associated with the clamping plate, wherein a voltage applied to the one or more electrodes is operable to selectively electrostatically attract the workpiece to the clamping surface for applying an electrostatic clamping force therebetween. In the present invention, one or more auxiliary mechanical clamping members are further provided wherein the one or more auxiliary clamping members are configured to selectively secure at least a portion of the workpiece to the clamping surface. A temperature monitoring device configured to determine a temperature of the workpiece is also provided, and a controller is configured to selectively clamp the workpiece to the clamping surface via control of the one voltage applied to the one or more electrodes and/or control of the one or more auxiliary clamping members, based, at least in part, on the temperature of the workpiece.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
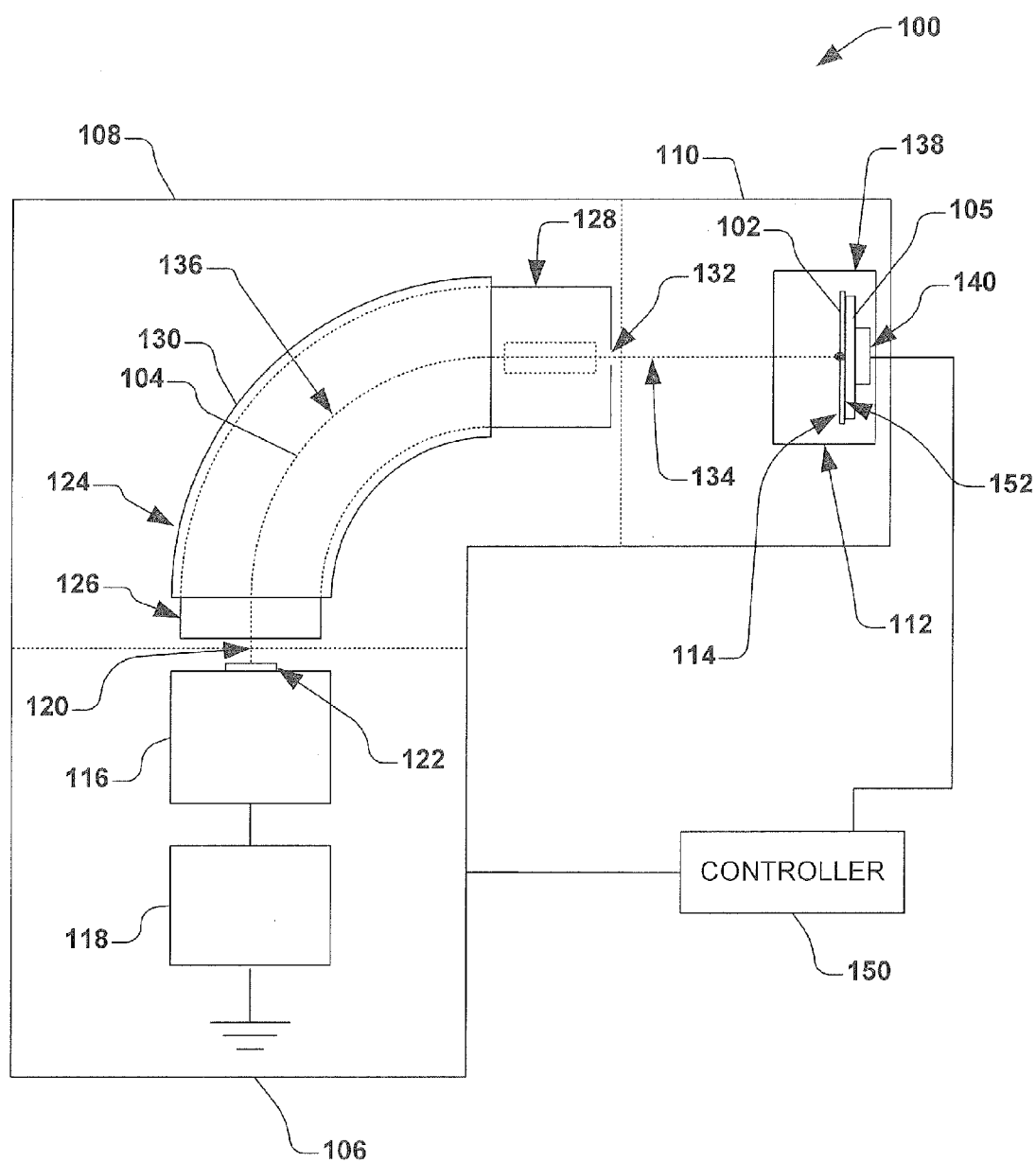
FIG. 1 is a schematic of an exemplary ion implantation system according to one aspect of the disclosure.

The inventors presently appreciate that high temperature processing can adversely affect clamping forces between a workpiece and an electrostatic clamp, where it is believed that a dielectric layer on the electrostatic clamp begins to break down as a result of the high temperature, thus adversely affecting a conductivity of the dielectric layer. An increase in conductivity of the dielectric layer limits a capability of the electrostatic clamp to produce a high enough electric field to clamp and hold the workpiece in a fixed position relative to a support surface thereof.

Thus, the present invention is directed generally toward an electrostatic clamp that provides improved clamping at high temperatures (e.g., on the order of 600 C-1000 C) by providing a supplemental mechanical clamping mechanism to the electrostatic clamp. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, in accordance with one exemplary aspect of the present invention, FIG. 1 illustrates an exemplary ion implantation system 100, wherein the ion implantation system is operable to scan a workpiece 102 (e.g., a semiconductor substrate or wafer comprising one or more of silicon, silicon carbide, germanium, and gallium arsenide) relative to an ion beam 104, therein implanting ions into the workpiece. An electrostatic clamp 105 (also called an electrostatic chuck or ESC) generally clamps the workpiece 102 thereto, as will be discussed in greater detail infra.

As stated above, various aspects of the present invention may be implemented in association with any type of ion implantation apparatus, including, but not limited, to the exemplary system 100 of FIG. 1. The exemplary ion implantation system 100 comprises a terminal 106, a beamline assembly 108, and an end station 110 that generally forms a process chamber 112, wherein the ion beam 104 is generally directed at the workpiece 102 positioned at a workpiece location 114. An ion source 116 in the terminal 106 is powered by a power supply 118 to provide an extracted ion beam 120 (e.g., an undifferentiated ion beam) to the beamline assembly 108, wherein the ion source comprises one or more extraction electrodes 122 to extract ions from the source chamber and thereby to direct the extracted ion beam toward the beamline assembly 108.

The beamline assembly 108, for example, comprises a beamguide 124 having an entrance 126 proximate to the source 116 and an exit 128 proximate to the end station 110. The beamguide 124, for example, comprises a mass analyzer 130 (e.g., a mass analysis magnet) that receives the extracted ion beam 120 and creates a dipole magnetic field to pass only ions of appropriate energy-to-mass ratio or range thereof through a resolving aperture 132 to the workpiece 102. The ions passed through the mass analyzer 130 and exit the resolving aperture 132 generally define a mass analyzed or desired ion beam 134 having ions of the desired energy-to-mass ratio or range thereof. Various beam forming and shaping structures (not shown) associated with the beamline assembly 108 may be further provided to maintain and bound the ion beam 104 when the ion beam is transported along a desired beam path 136 to the workpiece 102.

In one example, the desired ion beam 134 is directed toward the workpiece 102, wherein the workpiece is generally positioned via a workpiece scanning system 138 associated with the end station 110. The end station 110 illustrated in FIG. 1, for example, may comprise a "serial" type end station that provides a mechanical scanning of the workpiece within the evacuated process chamber 112, in which the workpiece 102 (e.g., a semiconductor wafer, display panel, or other workpiece) is mechanically translated through the beam path 136 in one or more directions via a workpiece scanning system 138. According to one exemplary aspect of the present invention, the ion implantation system 100 provides the desired ion beam 134 (e.g., also referred to as a "spot beam" or "pencil beam") as being generally stationary, wherein the workpiece scanning system 138 generally translates the workpiece 102 in two generally orthogonal axes with respect to the stationary ion beam. It should be noted, however, that batch or other type end stations may alternatively be employed, wherein multiple workpieces 102 may be scanned simultaneously, and such end stations are contemplated as falling within the scope of the present invention.

In another example, the system 100 may comprise an electrostatic beam scanning system (not shown) operable to scan the ion beam 104 along one or more scan planes relative to the workpiece 102. Accordingly, the present invention further contemplates any scanned or non-scanned ion beam 104 as falling within the scope of the present invention. In accordance with one embodiment of the present invention, the workpiece scanning system 138 comprises a scan arm 140, wherein the scan arm is configured to reciprocally scan the workpiece 102 with respect to the ion beam 104. The ion implantation system 100, for example, is further controlled by a controller 150, wherein functionality of the ion implantation system and workpiece scanning system 138 is controlled via the controller.

In accordance with one exemplary aspect of the disclosure, the ESC 105 is utilized to electrostatically hold the workpiece 102 (e.g., a semiconductor wafer) to a clamping surface 152 thereof. As illustrated in greater detail in FIG. 2, an insulating layer 154 (e.g., a dielectric layer) generally defines the clamping surface 152 of the ESC 105, wherein the insulating layer generally permits a capacitance to build between the workpiece 102 and one or more electrodes 156 positioned within the ESC. The one or more electrodes 156, for example, are powered by a power supply 158 and encapsulated in a ceramic layer 160, wherein the ceramic layer is mounted to a backing plate 162 (e.g., an aluminum plate), and wherein the backing plate provides a structural rigidity to the ESC 105. The backing plate 162 may also provide a structure by which cooling or heating can be applied to the ESC 105, such as through one or more cooling channels 164, one or more heaters 166, or the like.

Figure 2:
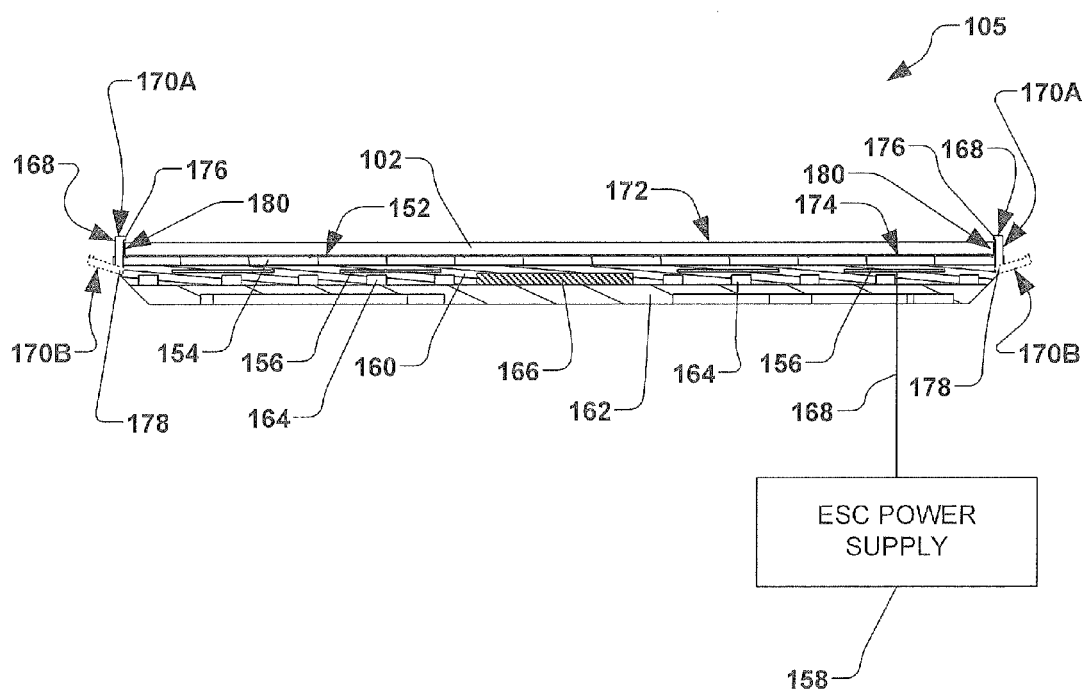
FIG. 2 is a cross-sectional view of an electrostatic clamp in accordance with another exemplary aspect of the disclosure.

According to one aspect of the present invention, additional mechanical clamping capability is further provided in addition to the electrostatic clamping capability shown in the ESC 105 of FIG. 2. By way of example, when merely providing electrostatic clamping to the electrostatic chuck 105 via the one or more electrodes 156, problems may arise in high temperature applications, such as when applying temperatures approaching or exceeding 1000 C to the ESC via the one or more heaters 166. At such high temperatures (e.g., above a few hundred degrees C.), for example, the inventors appreciate that the insulating layer 154 between the one or more electrodes 156 and the workpiece 102 being clamped has a tendency to become slightly conductive, wherein as the conductivity increases, at some point, the conductivity of the insulating layer becomes so high that the electrostatic clamp power supply 158 becomes unable to maintain the desired clamping force. As such, the electrostatic clamp 105 fails to produce a high enough electric field to effectively electrostatically clamp the workpiece 102 to the clamping surface 152.

Therefore, in accordance with the present invention, one or more auxiliary mechanical clamps 168 are provided, wherein the one or more auxiliary mechanical clamps provide additional (e.g., backup) clamping to maintain the fixed position of the workpiece 102 on the clamping surface 152, thereby permitting process temperatures to be increased beyond the limitations of the electrostatic clamping force. The one or more auxiliary mechanical clamps 168, for example, are selectively utilized when processing temperatures exceed a predetermined temperature (e.g., approximately 200 C, or higher). The insulating layer 154 of the ESC 105, for example, is manufactured with appropriate materials that can physically withstand temperatures in excess of 1000 C without failing due to thermal stress or differential expansion; however, the insulating layer may still be limited by increased electrical conductivity of the material at such high temperatures. Increased electrical conductivity (e.g., increased current flow through the insulating layer 154 during clamping of the workpiece 102) deleteriously affects clamping force capabilities of the ESC 105.

Thus, in the present example, the one or more auxiliary mechanical clamps 168 are provided, wherein the one or more auxiliary mechanical clamps are configured to translate and/or rotate between an engaged position 170A and a disengaged position 170B. At processing temperatures lower than the predetermined temperature, for example, the one or more auxiliary mechanical clamps 168 are selectively positioned in the disengaged position 170B, and are unobtrusive to the processing of the workpiece 102, thereby permitting "normal" electrostatic clamping of the workpiece during processing at lower temperatures without increasing the risk of particles or potential contamination due to contact of the one or more auxiliary mechanical clamps with the workpiece. However, when processing temperatures are increased, such as temperatures exceeding 200 C, one or more of the one or more auxiliary mechanical clamps 168 are configured to be selectively positioned in the engaged position 170A, therein providing additional clamping capabilities to the ESC 105, such as when increased electrical conductivity through the insulating layer 154 deteriorates electrostatic clamping forces.

Thus, in accordance with the present disclosure, process recipes for processing the workpiece 102 at a process temperature (e.g., a temperature of the workpiece 102 and/or ESC 105) above the predetermined temperature, for example, are advantageously provided with additional mechanical clamping by the one or more auxiliary mechanical clamps 168. Further, in one advantageous aspect, the one or more auxiliary mechanical clamps 168 are selectively activated, such that when electrostatic clamping is either not effective as described above, or is not desired for various reasons, wherein the one or more auxiliary mechanical clamps are configured to provide sufficient clamping capabilities to maintain the workpiece 102 in a generally fixed position 172 with respect to the ESC (e.g., parallel and/or perpendicularly to the clamping surface 152).

The one or more auxiliary mechanical clamps 168 of the present invention, for example, are further configured to be stowed or otherwise positioned below a plane 174 (e.g., the clamping surface 152) associated with the workpiece 102 when the one or more auxiliary mechanical clamps are not activated (e.g., when the one or more auxiliary mechanical clamps are not mechanically clamping the workpiece to the clamping surface of the ESC 105). Accordingly, when the one or more auxiliary mechanical clamps 168 are not activated (e.g., in the disengaged position 170B), material sputter and associated particle contamination arising from the use of the one or more auxiliary mechanical clamps is mitigated. For example, when the one or more auxiliary mechanical clamps 168 are stowed below the plane 174 associated with the workpiece 102 and/or clamping surface 152, the workpiece generally shields components associated with the one or more auxiliary mechanical clamps from a process medium (e.g., the ion beam 134 of FIG. 1, a plasma, or chemical vapor, etc.) to which the workpiece is exposed.

Figure 3:
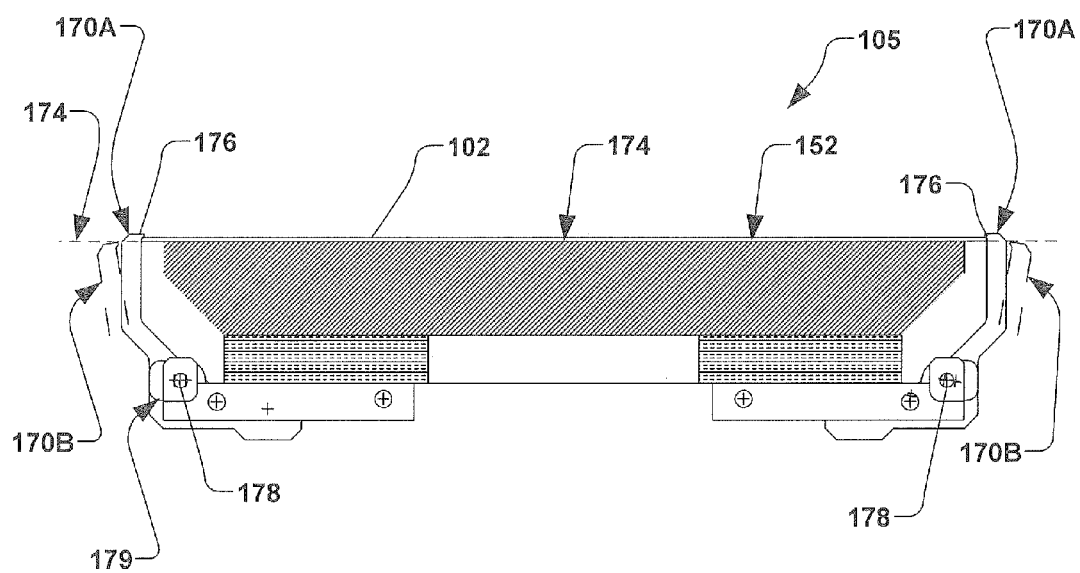
FIG. 3 is another cross-sectional view of an electrostatic clamp in accordance with yet another exemplary aspect of the disclosure.

The one or more auxiliary mechanical clamps 168, in another example, are configured to translate and/or rotate with respect to the clamping surface 152, so as to not interfere with a transfer of the workpiece 102 to and/or from the ESC 105, as illustrated in greater detail in FIG. 3. For example, at least one of the one or more auxiliary mechanical clamps 168 of FIGS. 2 and 3 comprise one or more hooks 176 or "fingers" configured to rotate about one or more axes 178 between the engaged position 170A and the disengaged position 170B, wherein the one or more auxiliary mechanical clamps rotate below the plane 174 of the clamping surface 152 in the disengaged position, thus generally permitting a workpiece handling apparatus (not shown) to lift the workpiece 102 from the clamping surface without hindrances associated with the one or more auxiliary mechanical clamps. The present invention further appreciates that while exemplary auxiliary mechanical clamps 168 are described and illustrated herein, various other structures and/or configurations of the one or more auxiliary mechanical clamps are possible, and all such structures and/or configurations, in conjunction with the electrostatic chuck 105, are contemplated as falling within the scope of the present invention. For example, a cam mechanism 179 is associated with the one or more axes 178, such as illustrated in various examples shown in FIGS. 3, 5, 7, and 8, wherein the one or more auxiliary mechanical clamps 168 are configured to rotate about the one or more axes while following a predetermined path.

Figure 4:
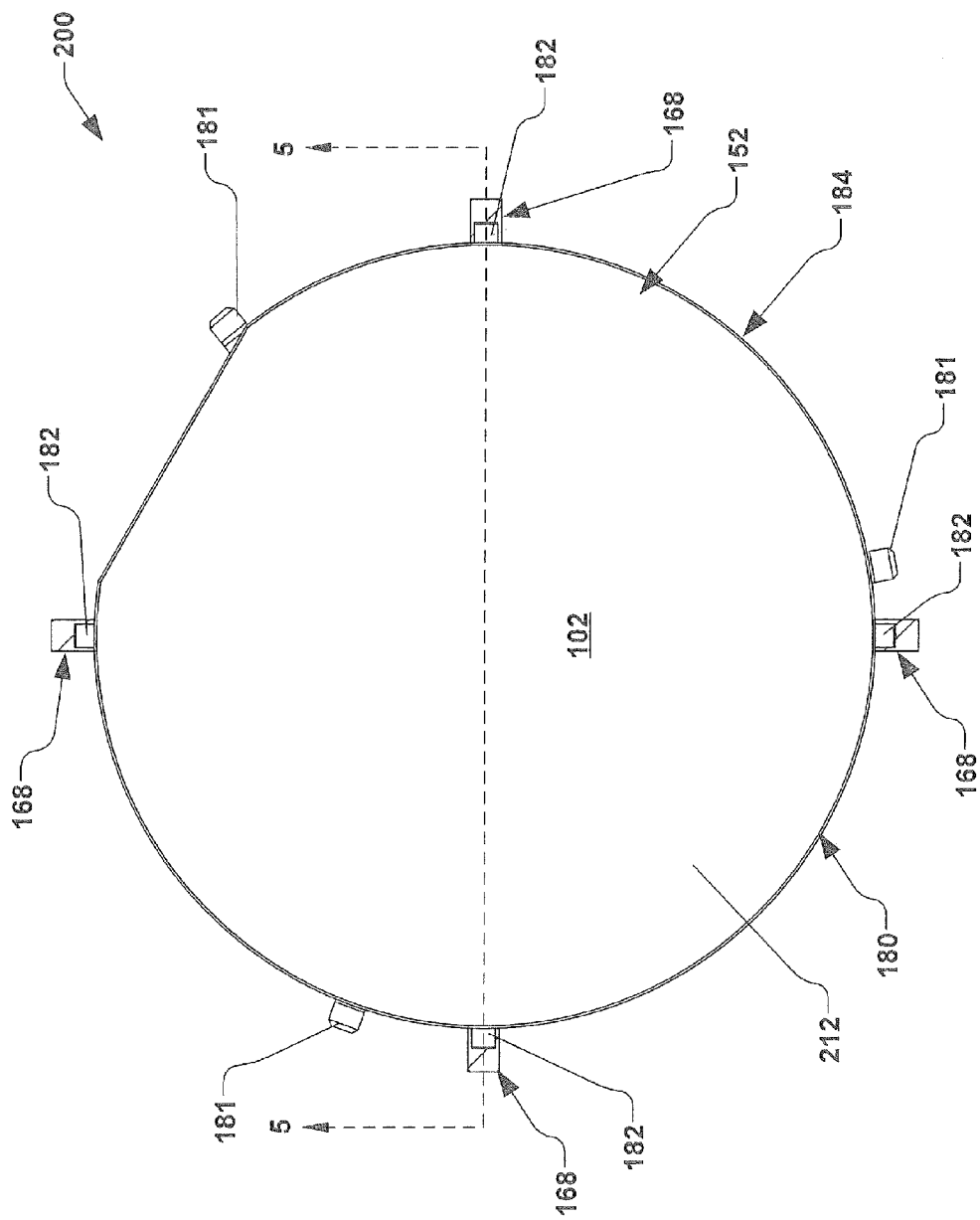
FIG. 4 is a plan view of an exemplary electrostatic clamp according to still another example of the disclosure.

In accordance with another exemplary aspect of the disclosure, the one or more auxiliary mechanical clamps 168 are configured to selectively engage an edge 180 (e.g., a circumference) of the workpiece 102, as illustrated in FIGS. 2 and 4. For example, in a situation where the workpiece 102 of FIG. 1 is scanned through a process medium such as the ion beam 134 via a workpiece scanning system 138 (e.g., the scan arm 140), the one or more auxiliary mechanical clamps 168 of FIG. 2, in coordination with a control algorithm associated with the controller 150, are configured to selectively engage the edge 180 of the workpiece prior to an angle the scan arm exceeding a predetermined angle from horizontal. For example, in a "load position" the workpiece 102 may be placed on the clamping surface 152 with the clamping surface at zero degrees (e.g., horizontally oriented); however, during an exemplary scanning of the workpiece 102 through the process medium (e.g., the ion beam 134), the workpiece can be translated to a non-horizontal orientation in order to achieve a proper implantation of ions into the workpiece. At such a non-horizontal orientation, the one or more auxiliary mechanical clamps 168 of FIG. 2, for example, are configured to selectively engage the workpiece 102 when the clamping surface 152 exceeds a predetermined angle with respect to horizontal (e.g., 30 degrees). Accordingly, the one or more auxiliary mechanical clamps 168 are configured to selectively mechanically clamp the workpiece 102 when gravitational forces would otherwise permit the workpiece to move with respect to the clamping surface 152. As such, the one or more auxiliary mechanical clamps 168 of the present disclosure can be utilized with or without electrostatic clamping in such an environment, wherein the auxiliary clamping of the one or more auxiliary mechanical clamps overcomes gravitation forces on the workpiece 102.

The one or more auxiliary mechanical clamps 168 of another exemplary ESC 200, as illustrated in FIG. 4, for example, can be further or alternatively configured such that they act as a circumferential restraining device or "fence" in order to keep the workpiece 102 centered on the ESC 200. In one example, the one or more auxiliary mechanical clamps 168 are configured to provide a downward force on the workpiece 102 toward the clamping surface 152, thus pressing the workpiece against the clamping surface of the electrostatic chuck 105. However, the present invention also contemplates no downward pressure being applied by the one or more auxiliary mechanical clamps 168. For example, the one or more auxiliary mechanical clamps 168 may provide only a circumferential boundary, as for example via three or more pins 181 extending outwardly from the clamping surface 152 positioned about the circumference of the workpiece 102, wherein no or minimal circumferential force is applied to the workpiece. Alternatively, it is further contemplated that the one or more auxiliary mechanical clamps 168 comprise a circumferential clamping force is applied to the workpiece 102 via three or more clamping members 182 positioned about the circumference 184 of the workpiece 102 that can be selectively translated (e.g., radially, pivotally, or linearly), thereby selectively applying circumferential clamping pressure to the workpiece.

In accordance with still another exemplary aspect of the invention, the one or more auxiliary mechanical clamps 168 are generally rigid, wherein the one or more auxiliary mechanical clamps generally prevent any motion of the workpiece 102 relative to the clamping surface 152. For example, in a process wherein the workpiece 102 is scanned relative to the process medium (e.g, the ion beam 134 of FIG. 1), significant accelerations and decelerations of the electrostatic clamp 200 are present as the workpiece is reciprocally scanned through the process medium. Accordingly, the clamping members 182 of the one or more auxiliary mechanical clamps 168 are preferably substantially rigid so as to prevent deformation thereof, and to substantially maintain the position of the workpiece 102 relative to the clamping surface 152 of the electrostatic chuck 200.

Figure 5:
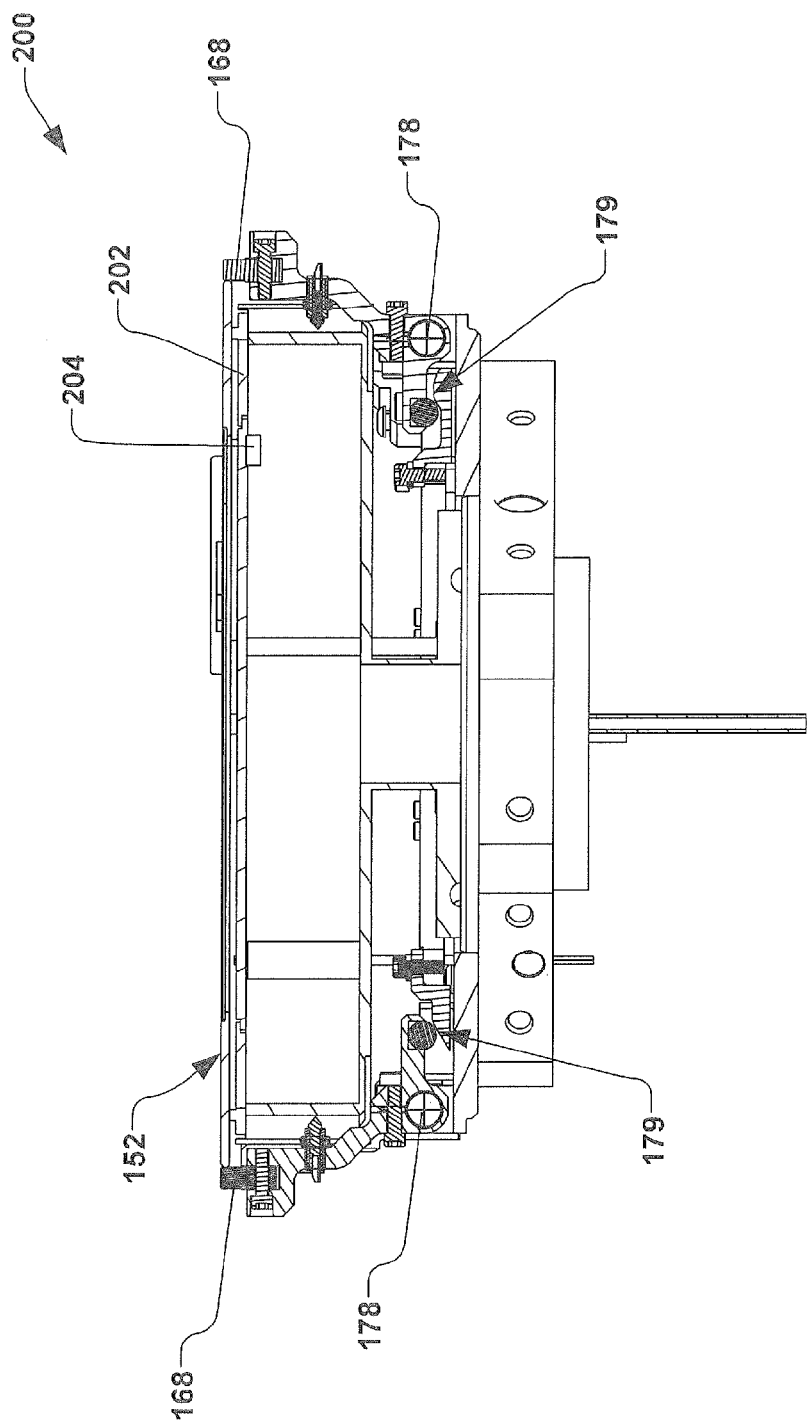
FIG. 5 is a cross-sectional view of the electrostatic clamp of FIG. 4 in accordance with another exemplary aspect of the disclosure.

According to yet another exemplary aspect of the invention, as illustrated in greater detail in FIG. 5, the electrostatic clamp 200 comprises a heater 202 configured to selectively heat the workpiece 102 of FIG. 4 positioned on the clamping surface 152 thereof. The heater 202 of FIG. 5, for example, comprises lamp elements, resistive heater elements, and/or any other of a multitude of heating devices that are embedded within the electrostatic chuck 200 or can otherwise transfer heat to the workpiece 102 so that the workpiece is at an elevated temperature during processing. Preferably, the electrostatic clamp 200 further comprises a temperature monitoring apparatus 204, such as a thermostat, thermocouple, or other temperature monitoring device configured to determined a temperature of one or more of the clamping surface 152 of the electrostatic clamp 200 and the workpiece 102 of FIG. 4.

Accordingly, the controller 150 of FIG. 1 is further configured to selectively actuate the one or more auxiliary mechanical clamps 168 when the temperature of one or more of the clamping surface 152 and workpiece 102 exceed a predetermined temperature, thereby providing auxiliary mechanical clamping of the workpiece to the ESC 105 at and above the predetermined temperature. Such a control, in one example, is configured to actuate the one or more auxiliary mechanical clamps 168 only when the heater 202 of FIG. 5 is activated, and when the monitored temperature exceeds the predetermined value. As such, the one or more auxiliary mechanical clamps 168 remain in a retracted or disengaged position 170B (and preferably stowed) during processing such that the one or more auxiliary mechanical clamps extend and clamp the workpiece 102 only when necessary, such as when due to diminished electrostatic clamping force caused by the increased temperature of the ESC 200 described above.

Figure 6:
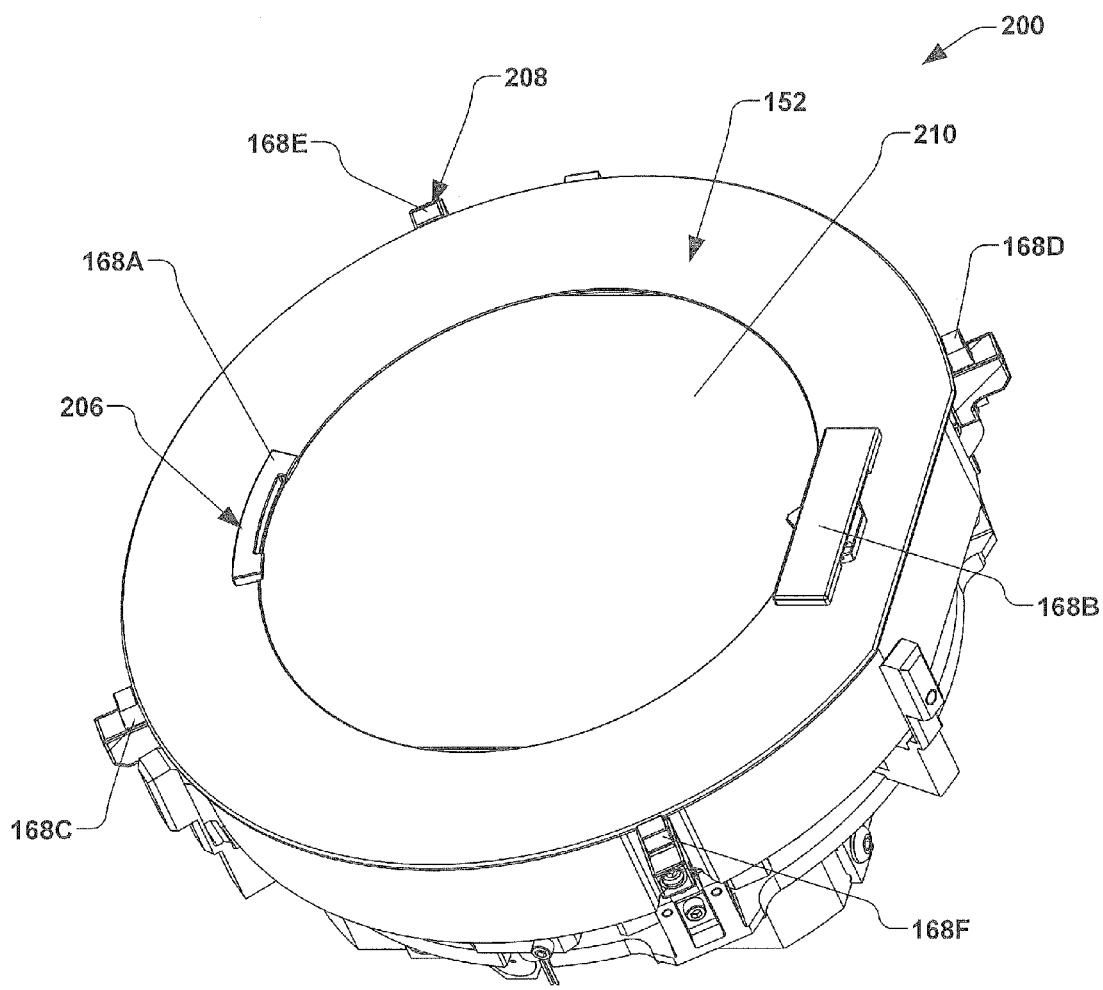
FIG. 6 is a perspective view of another exemplary electrostatic clamp according to a further exemplary aspect of the disclosure.

FIG. 6 illustrates the exemplary ESC 200 in a perspective view, wherein ESC is configured to selectively clamp various sizes of workpieces. In accordance with the present example, the one or more auxiliary mechanical clamps 168 are divided into a first clamping set 206 and a second clamping set 208, wherein the first clamping set is configured to selectively mechanically clamp a first workpiece 210 of a first size, as illustrated in FIG. 5. The first clamping set 206 comprises auxiliary mechanical clamps 168A and 168B. The second clamping set 208, for example, is configured to selectively mechanically clamp a second workpiece 212 illustrated in FIG. 4 of a second size, wherein the second size is larger than the first size. The second clamping set 208 thus comprises auxiliary mechanical clamps 168C-168F.

Figure 7:
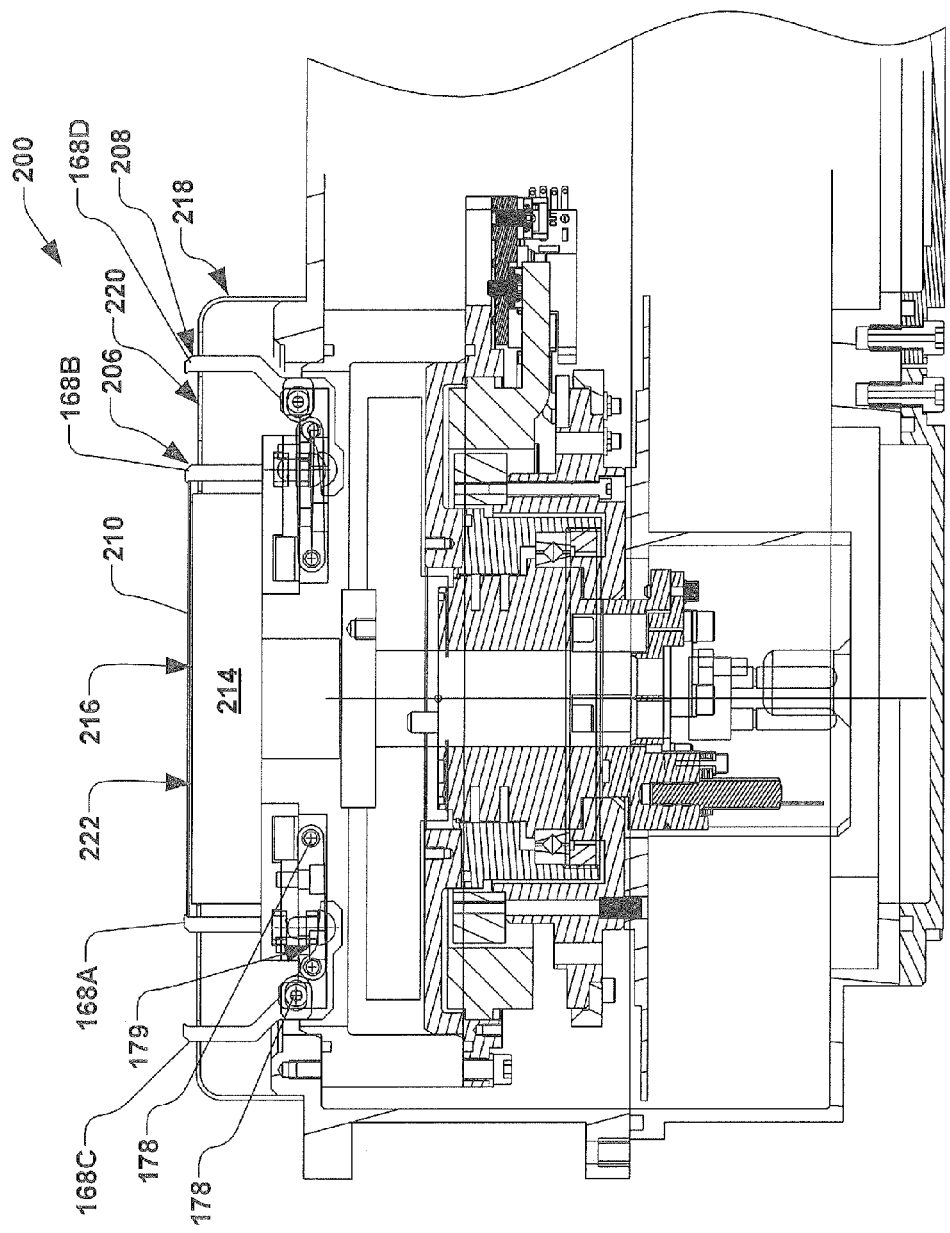
FIG. 7 is a cross-sectional view of an electrostatic clamp holding a first workpiece of a first size according to another example of the disclosure.
Figure 8:
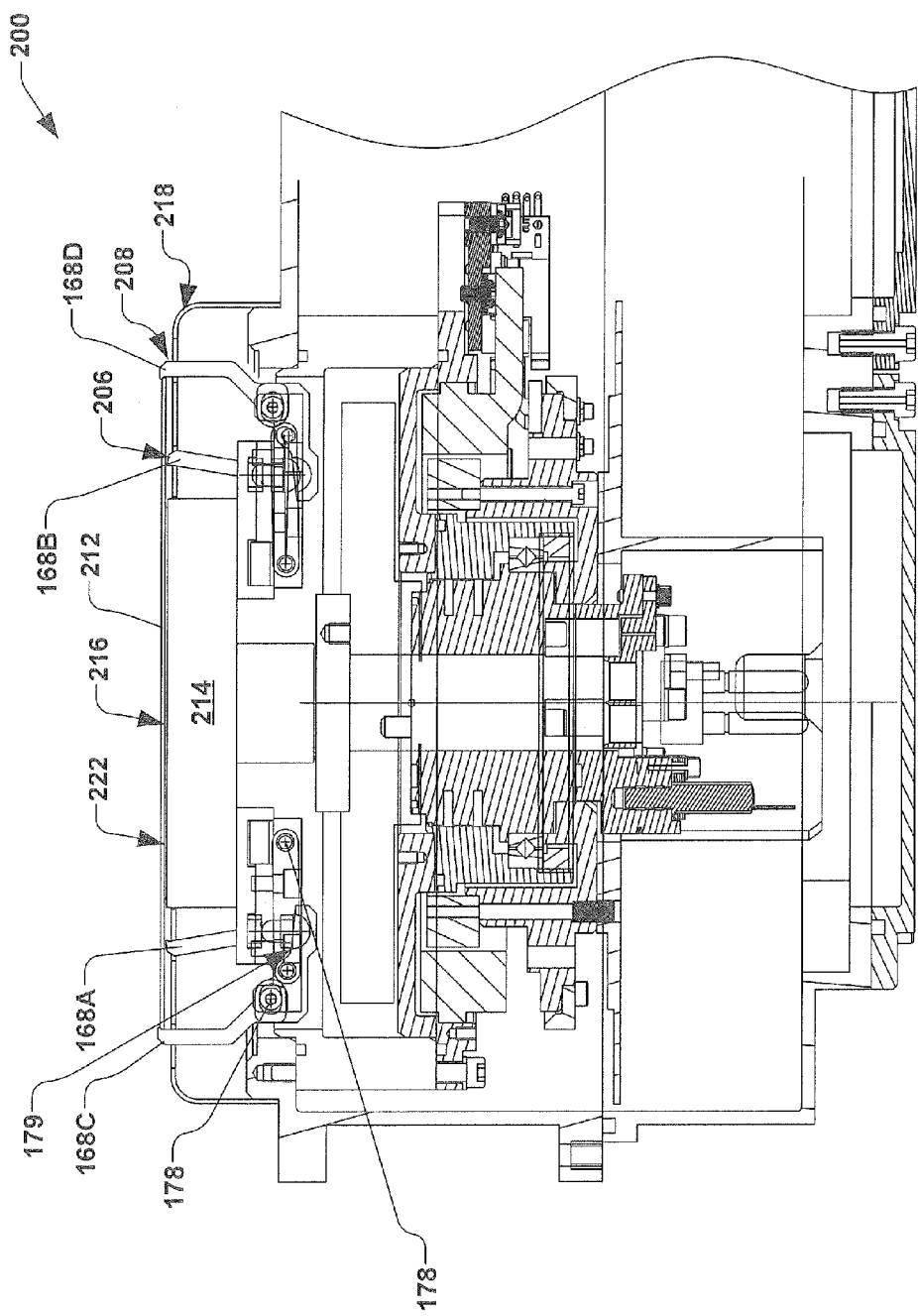
FIG. 8 is a cross-sectional view of the electrostatic clamp of FIG. 7 holding a second workpiece of a second size according to another example of the disclosure.

FIG. 7, for example, illustrates a cross-sectional view of the ESC 200 of FIG. 6, wherein the first workpiece 210 of the first size is clamped via the first clamping set 206. As such, the first workpiece 210 rests on a ceramic heater 214, wherein the auxiliary mechanical clamps 168A and 168B clamp the first workpiece 210 to a clamping surface 216. In accordance with one example, a shield 218 is provided with slots 220 for the second clamping set 208 to extend through, wherein the shield generally shields components residing below a plane 222 of the clamping surface 216. such as the FIG. 8 illustrates the ESC 200 of FIG. 6, wherein the second workpiece 212 (which is larger than the first workpiece 210 of FIG. 7) is clamped to the clamping surface 216 via the second clamping set 208 comprising the auxiliary mechanical clamps 168C-168F of FIG. 6. When the second workpiece 212 is clamped to the ESC 200, the first clamping set 206 are positioned in the disengaged position 170B which is generally below the plane 222 of the clamping surface 216.

Figure 9:
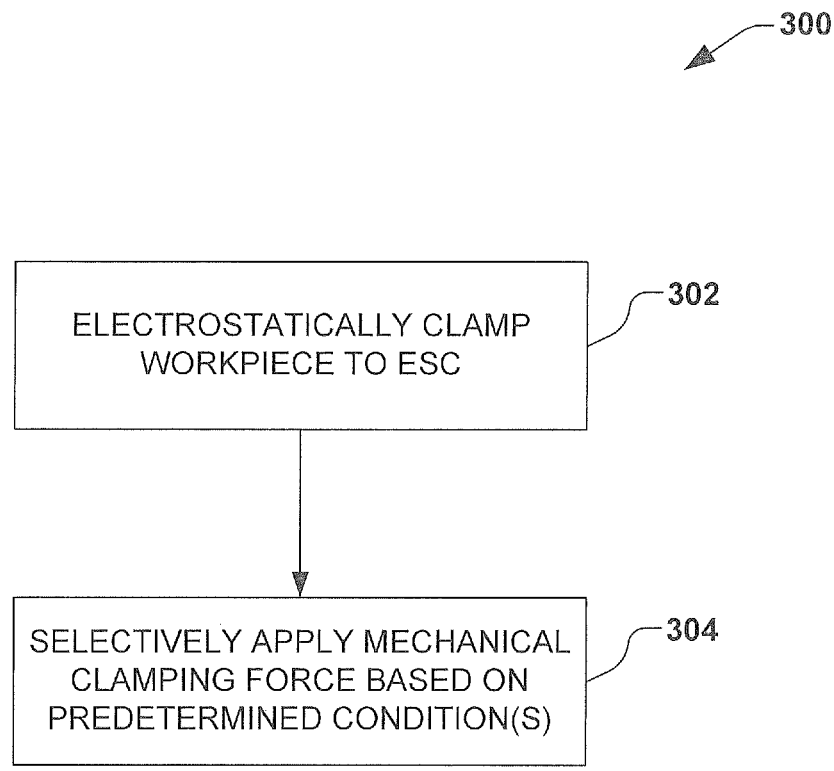
FIG. 9 is an exemplary methodology for clamping a workpiece according to a further aspect of the disclosure.

FIG. 9 illustrates an exemplary method 300 for effectively clamping a workpiece to an electrostatic chuck. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 9, in accordance with one example, the method 300 comprises selectively electrostatically clamping a workpiece to a clamping surface of an electrostatic clamp via electrostatic force in act 302. To achieve the electrostatic force, for example, a clamping voltage is selectively applied to one or more electrodes of the electrostatic clamp. In accordance with the present invention, a mechanical clamping force is further selectively applied to the workpiece in act 304 via one or more auxiliary mechanical clamps. The application of the mechanical clamping force, for example, is applied based on one or more predetermined conditions. The one or more predetermined conditions, for example, comprise a temperature of one or more of the workpiece and the electrostatic clamp.

For example, the mechanical clamping force is applied once the temperature of the workpiece and/or electrostatic chuck meets or exceeds a predetermined temperature. The predetermined temperature, for example, is a temperature at which leakage current through the electrostatic chuck is above a predetermined amount due to an increased electrical conductivity of a dielectric layer of the electrostatic chuck at the predetermined temperature. The predetermined temperature, for example, is in excess of 200 C or higher. Accordingly, the method of the present invention advantageously engages workpiece via the one or more auxiliary mechanical clamps and mechanically clamps the workpiece to the clamping surface when the electrostatic attraction force to the workpiece is diminished due to the increased temperature of the electrostatic chuck and/or workpiece.

According to another example, the method 300 comprises selectively electrostatically clamping a workpiece to a clamping surface of an electrostatic chuck via electrostatic force in act 302, wherein a mechanical clamping force is further selectively applied to the workpiece in act 304 via one or more auxiliary mechanical clamps. The application of the mechanical clamping force, for example, is applied based on a predetermined condition wherein a clamping surface of the ESC is situated at a predetermined angle such that the mechanical clamping force is applied once the gravitational forces on the workpiece and/or electrostatic chuck meets or exceeds a predetermined amount. For example, the mechanical clamping force is applied when electrostatic forces associated with the electrostatic chuck are insufficient to maintain the workpiece at fixed position on the clamping surface as a result of the orientation of the ESC, or the translational forces applied to the ESC are insufficient to maintain the workpiece at the fixed position.

Accordingly, the present invention provides an electrostatic chuck that provides improved clamping capabilities, particularly at elevated processing temperatures. Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An electrostatic clamp, comprising:
    a clamping plate having a clamping surface, wherein a portion of the clamping surface is configured to contact both a first workpiece of a first size and second workpiece of a second size, wherein the second size is larger than the first size;
    one or more electrodes associated with the clamping plate, wherein a voltage applied to the one or more electrodes is operable to selectively electrostatically attract the first workpiece and second workpiece to said portion of the clamping surface; and
    one or more auxiliary clamping members respectively associated with a first clamping set and a second clamping set, wherein the first clamping set is configured to selectively mechanically clamp the first workpiece to the clamping surface, and wherein the second clamping set is configured to selectively mechanically clamp the second workpiece to the clamping surface, wherein only one of the first clamping set or second clamping set mechanically clamps the respective first workpiece or second workpiece to the clamping surface at a time.

2. The electrostatic clamp of claim 1, further comprising:
    a temperature monitoring device configured to determine a temperature associated with the first workpiece and second workpiece; and
    a controller configured to selectively clamp the respective first workpiece or second workpiece to the clamping surface via a control of the voltage applied to the one or more electrodes and a control of the one or more auxiliary clamping members, based, at least in part, on the temperature associated with the respective first workpiece or second workpiece.

3. The electrostatic clamp of claim 1, further comprising a heater associated with the clamping plate, wherein the heater is configured to selectively heat one or more of the clamping plate, the first workpiece, and the second workpiece.

4. The electrostatic clamp of claim 1, further comprising a backing plate, wherein the backing plate provides structural support and rigidity to the electrostatic clamp.

5. The electrostatic clamp of claim 1, wherein the one or more auxiliary clamping members are respectively configured to rotate about one or more axes and/or translate, wherein in an engaged position, a respective portion of the each of the one or more auxiliary clamping members is configured to engage a top surface of the respective first workpiece or second workpiece.

6. The electrostatic clamp of claim 5, wherein in a disengaged position, the one or more auxiliary clamping members are respectively configured to reside below a plane of the respective first workpiece or second workpiece.

7. The electrostatic clamp of claim 5, wherein at least one of the one or more auxiliary clamping members comprise a cam mechanism associated with the one or more axes.

8. The electrostatic clamp of claim 5, wherein the one or more auxiliary clamping members comprise one or more pins configured to selectively translate and/or rotate with respect to the clamping surface, therein selectively confining the respective first workpiece or second workpiece in at least a plane associated with the clamping surface.

9. The electrostatic clamp of claim 1, wherein the one or more auxiliary clamping members are respectively configured to selectively secure at least a portion of a circumference of the respective first workpiece or second workpiece, wherein the respective first workpiece or second workpiece is selectively generally prevented from moving along a plane of the clamping surface.

10. The electrostatic clamp of claim 1, wherein the one or more auxiliary clamping members are respectively configured to selectively engage one or more portions of a top plane of the respective first workpiece an or second workpiece, therein securing the respective first workpiece or second workpiece to the clamping surface, wherein the respective first workpiece or second workpiece is selectively generally prevented from moving perpendicular to a plane of the clamping surface.

11. The electrostatic clamp of claim 1, wherein the workpiece comprises one or more of silicon, silicon carbide, germanium, and gallium arsenide.

12. The electrostatic clamp of claim 1, wherein the clamping surface is substantially planar and wherein the first clamping set is configured to be selectively positioned generally below the plane of the clamping surface when the second workpiece resides on the clamping surface.

13. The electrostatic clamp of claim 1, wherein the first workpiece and second workpiece comprise a semiconductor wafer and are substantially planar.

14. The electrostatic clamp of claim 1, further comprising a controller configured to determine whether one or more predetermined conditions are met concurrent with exposing the first workpiece and second workpiece to a process medium and to selectively mechanically clamp the respective first workpiece or second workpiece to the clamping surface based on the determination, wherein the one or more predetermined conditions are selected from a group consisting of a measured temperature of the respective first and second workpiece and/or electrostatic clamp that meets or exceeds a predetermined temperature, a measured current associated with the electrostatic clamp that meets or exceeds a predetermined leakage current, a measured translational force applied to the electrostatic clamp that meets or exceeds a predetermined electrostatic force, and a measured angular position of the electrostatic clamp that meets or exceeds a predetermined angle.

15. The electrostatic clamp of claim 1, wherein the first clamping set is positioned a first distance from a center of the clamping plate, and wherein the second clamping set is positioned a second distance from the center of the clamping plate, wherein the first distance and second distance are different.

16. A method for clamping a workpiece to an electrostatic clamp, the method comprising:
selectively providing a clamping voltage to the electrostatic clamp, therein selectively electrostatically clamping the workpiece to a clamping surface thereof;
determining whether one or more predetermined conditions are met concurrent with exposing the workpiece to a process medium, wherein the one or more predetermined conditions are selected from a group consisting of a measured temperature of the workpiece and/or electrostatic clamp that meets or exceeds a predetermined temperature, a measured current associated with the electrostatic clamp that meets or exceeds a predetermined leakage current, a measured translational force applied to the electrostatic clamp that meets or exceeds a predetermined electrostatic force, and a measured angular position of the electrostatic clamp that meets or exceeds a predetermined angle;
determining whether a size of the workpiece is a first size or a second size; and
applying a mechanical clamping force to the workpiece only when the one or more predetermined conditions are met and not applying the mechanical clamping force when the one or more predetermined conditions are not met, therein selectively mechanically clamping the workpiece to the clamping surface, wherein applying the mechanical clamping force to the workpiece comprises mechanically clamping the workpiece to the clamping surface with a first set of mechanical clamping members when the workpiece is the first size, and mechanically clamping the workpiece to the clamping surface with a second set of mechanical clamping members when the workpiece is the second size, and wherein the second size is larger than the first size, wherein only one of the first set of mechanical clamping members or second set of mechanical clamping members mechanically clamps the workpiece of the respective first size or second size to the clamping surface at a time.

17. The method of claim 16, wherein the predetermined leakage current is associated with an increased electrical conductivity of a dielectric layer of the electrostatic clamp at the predetermined temperature.

18. The method of claim 16, wherein the predetermined temperature is in excess of 200 C.

19. The method of claim 16, wherein the application of the mechanical clamping force is applied to a circumference of the workpiece.

20. The method of claim 16, wherein the selective application of the mechanical clamping force is applied to a top surface of the workpiece.

21. The method of claim 16, wherein the clamping voltage is halted after the mechanical clamping force is applied.

22. The method of claim 16, wherein the predetermined electrostatic force comprises a force that is insufficient to maintain the workpiece at a fixed position with respect to the electrostatic clamp.

23. The method of claim 16, wherein the predetermined angle comprises an angle at which electrostatic forces associated with the electrostatic clamp are insufficient to maintain the workpiece at the fixed position with respect to the electrostatic clamp.

24. The method of claim 16, further comprising positioning one or more of the first set of clamping members and second set of clamping members in a disengaged position below a plane of the respective first workpiece and second workpiece when not mechanically clamping the workpiece to clamping surface.

* * * * *